(12) United States Patent
Goldstein

(10) Patent No.: US 6,671,054 B2
(45) Date of Patent: Dec. 30, 2003

(54) INTERFEROMETRIC PATTERNING FOR LITHOGRAPHY

(75) Inventor: Michael Goldstein, Ridgefield, CT (US)

(73) Assignee: Intel Corporation, Santa Clara, CA (US)

( * ) Notice: Subject to any disclaimer, the term of this patent is extended or adjusted under 35 U.S.C. 154(b) by 77 days.

(21) Appl. No.: 10/071,814

(22) Filed: Feb. 7, 2002

(65) Prior Publication Data

US 2003/0147082 A1 Aug. 7, 2003

(51) Int. Cl.⁷ .................................................. G01B 9/02
(52) U.S. Cl. ........................................ 356/450; 356/521
(58) Field of Search ................................. 356/450, 521

(56) References Cited

U.S. PATENT DOCUMENTS 3,633,037 A  *  1/1972  Langenbeck ................. 250/395
3,698,814 A  *  10/1972  Clark .......................... 356/517

OTHER PUBLICATIONS

Claude Montcalm et al., "Extreme Ultraviolet Coatings for the Next Generation Lithography," Optical Interference Coatings, OSA Technical Digest (Optical society iof America, Washington, DC 32001, pp. ThA1–1 to ThA1–3.

* cited by examiner

Primary Examiner—Frank G. Font
Assistant Examiner—Andrew H. Lee
(74) Attorney, Agent, or Firm—Fish & Richardson P.C.

(57) ABSTRACT

Production of interference patterns from incoherent light sources by using an optical filter, a field mirror, and a plane mirror. The optical filter is designed to filter incoherent light waves and generate coherent light waves. The field mirror is arranged to convert the coherent light waves into plane waves. The plane mirror is arranged as a Lloyd's mirror to generate interference patterns from the plane waves.

25 Claims, 7 Drawing Sheets

well to FIGS. 3a and 3b, optical filter 102 reduces the
INTERFEROMETRIC PATTERNING FOR LITHOGRAPHY

TECHNICAL FIELD

This invention relates to interferometric patterning.

BACKGROUND

Interference patterns of alternating bright and dark lines are used to expose photo-resists to test their quality and to determine the resolution that can be achieved. Optical schemes for generating interference patterns are illustrated in FIG. 1a and FIG. 1b. In FIG. 1a, an arrangement known as Young's configuration, two overlapping beams 106 and 108 of plane waves generate interference patterns on a substrate 102. In FIG. 1b, an arrangement known as a Lloyd's mirror, a plane mirror 104 is used to divert a portion of a beam 110 such that it interferes with another portion to produce interference patterns on substrate 102.

The exposed photo-resist has line structures with a pitch, p, given by $p=\lambda/(2\times\sin[\theta])$, where $\lambda$ is the wavelength of the plane waves and $\theta$ is the half-angle of convergence. This pitch increases with wavelength. The line size is set by selection of the amount of time and intensity of exposure. A higher amount of exposure results in a smaller line width when using a positive tone photo-resist (i.e., a resist having the portions exposed to light removed after development).

Typically, coherent light sources are used to generate the interference patterns since interfering waves must be spatially and temporally coherent.

DESCRIPTION OF DRAWINGS

FIG. 2b is a ray-tracing diagram of a portion of the optical components of FIG. 2a.

Like reference symbols in the various drawings indicate like elements.

DETAILED DESCRIPTION

As described in more detail below, interference patterns are generated with optical arrangements that can utilize radiation from a source that is incoherent. Examples of sources are laser plasma or electric discharge plasma generating short wavelength radiation in the extreme ultraviolet (EUV) with a wavelength of about 13.4 nm. Small line structures on exposed photo-resist can be achieved. An embodiment of an optical arrangement includes an optical filter and a field mirror. The optical filter is configured to receive incident light waves and to generate coherent light waves. The field mirror is configured to convert the coherent light waves into plane waves. A mirror can be used in a Lloyd's mirror arrangement to reflect a portion of the plane waves so that the reflected portion interferes with the other portions to generate interference patterns on a surface.

Figure 1A:
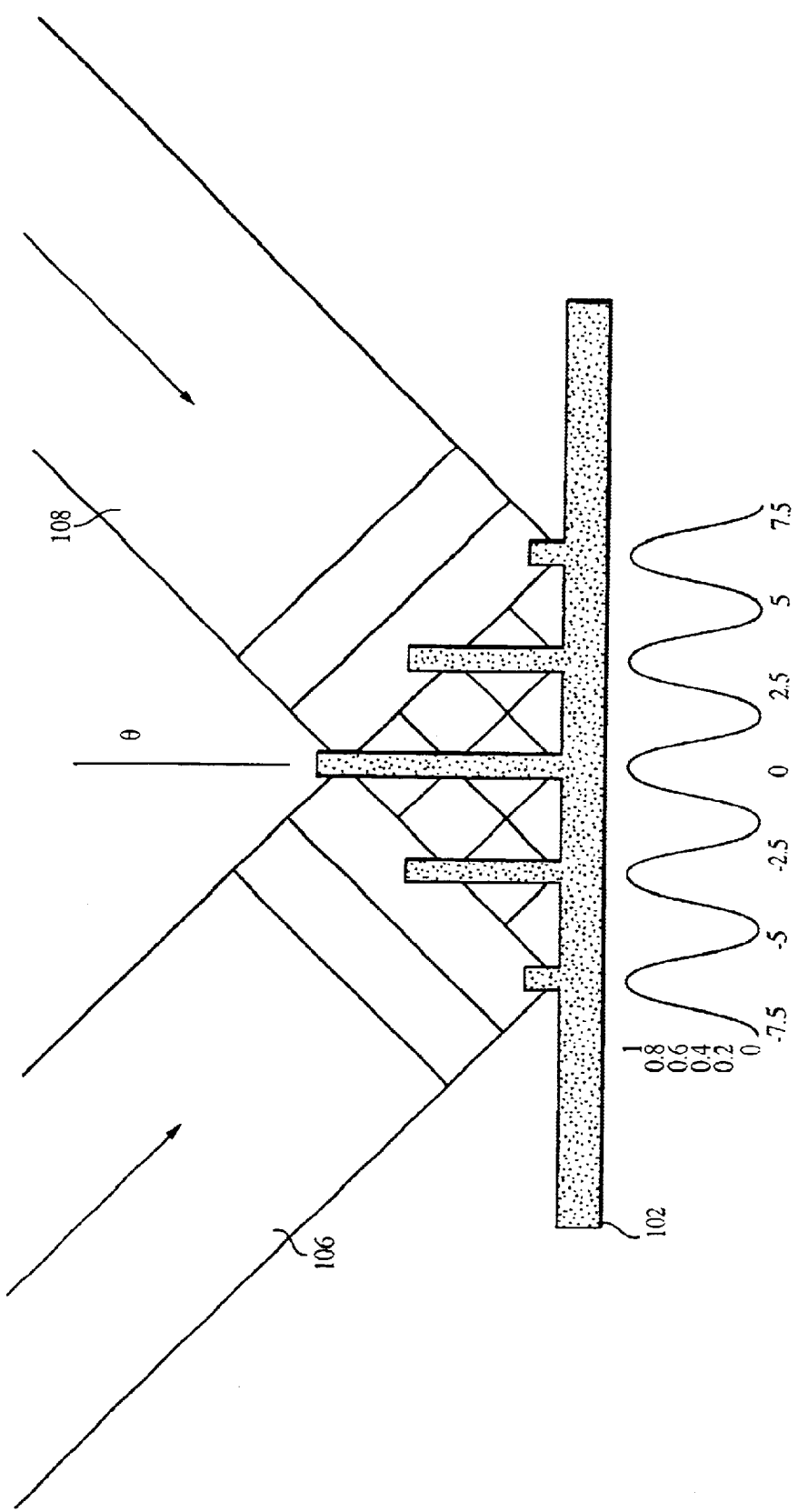
FIGS. 1a and 1b are schematic illustrations of arrangements for generating interference patterns.
Figure 1B:
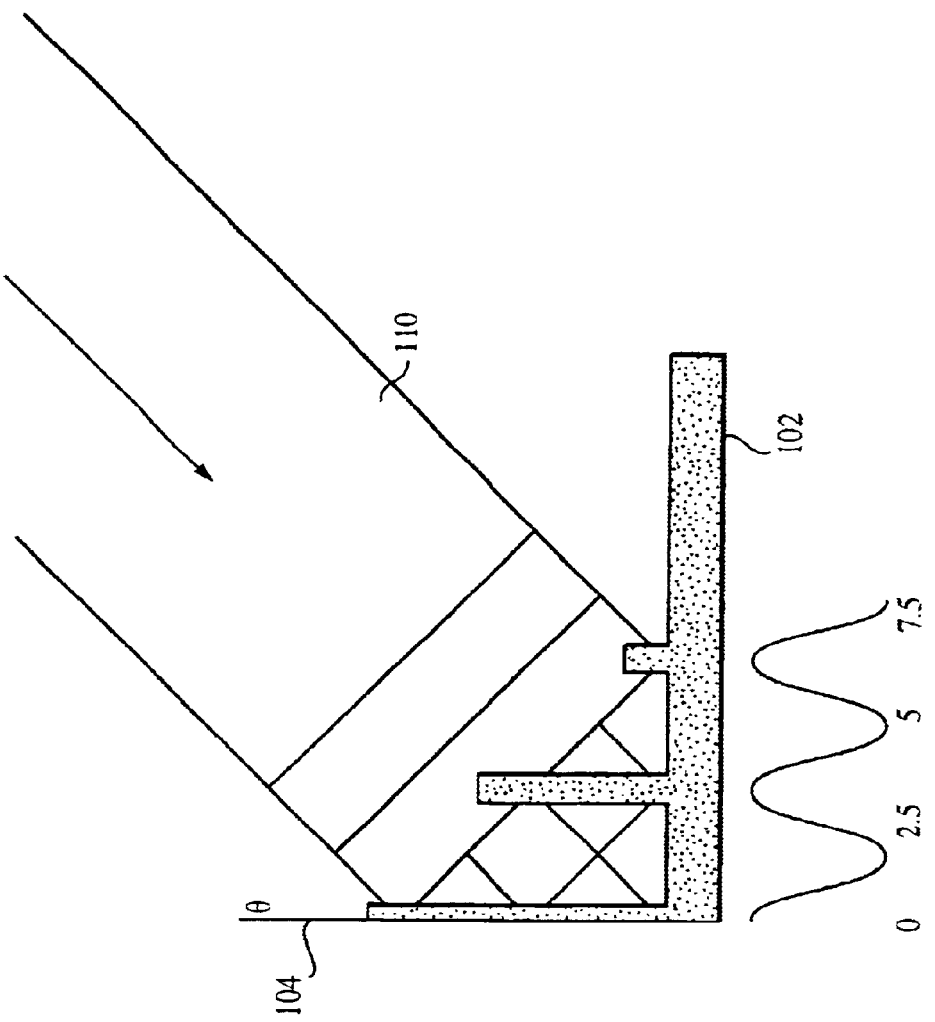
Figure 2A:
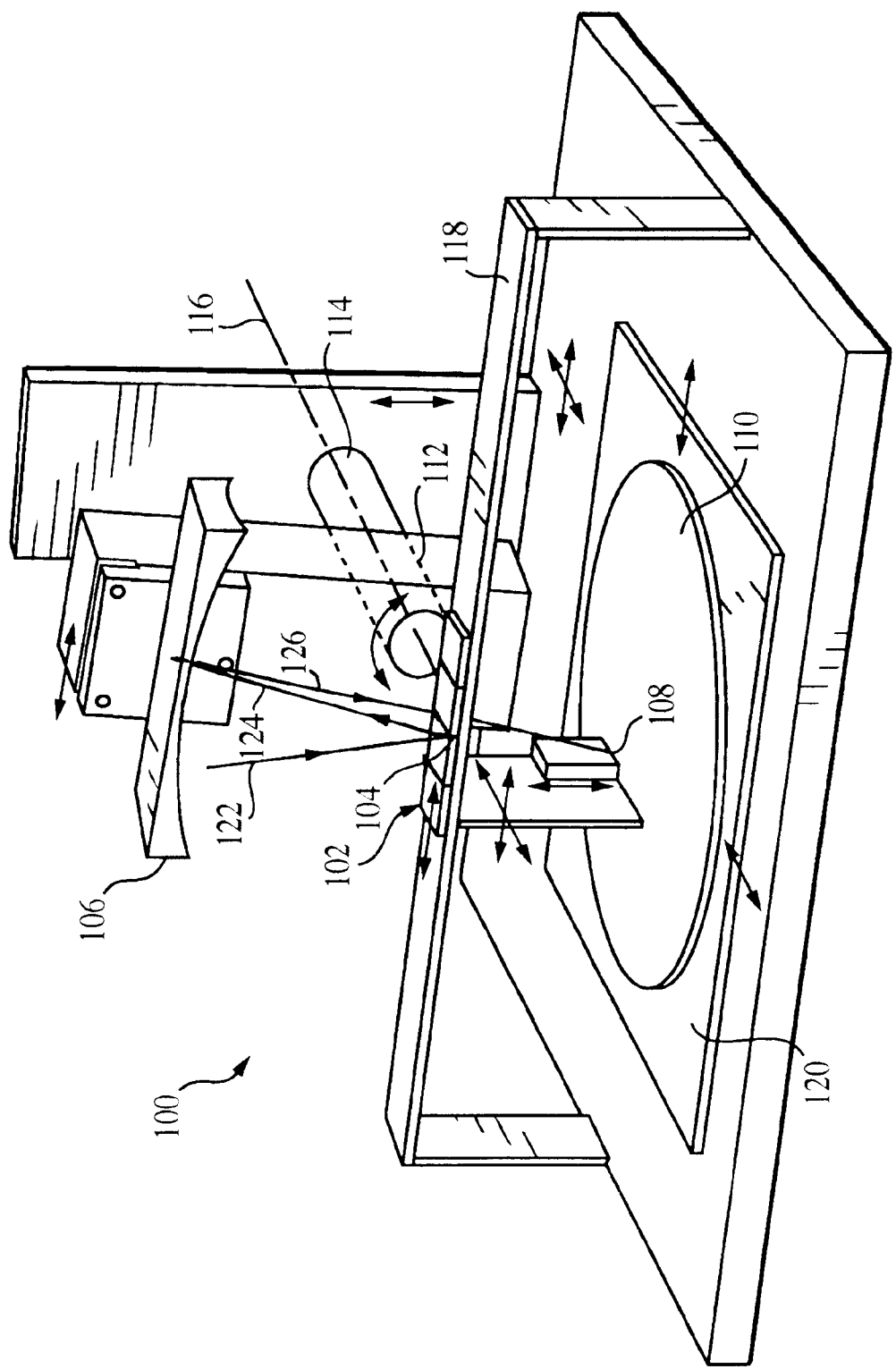
FIG. 2a is a perspective view of optical components for generating interference patterns.
Figure 2B:
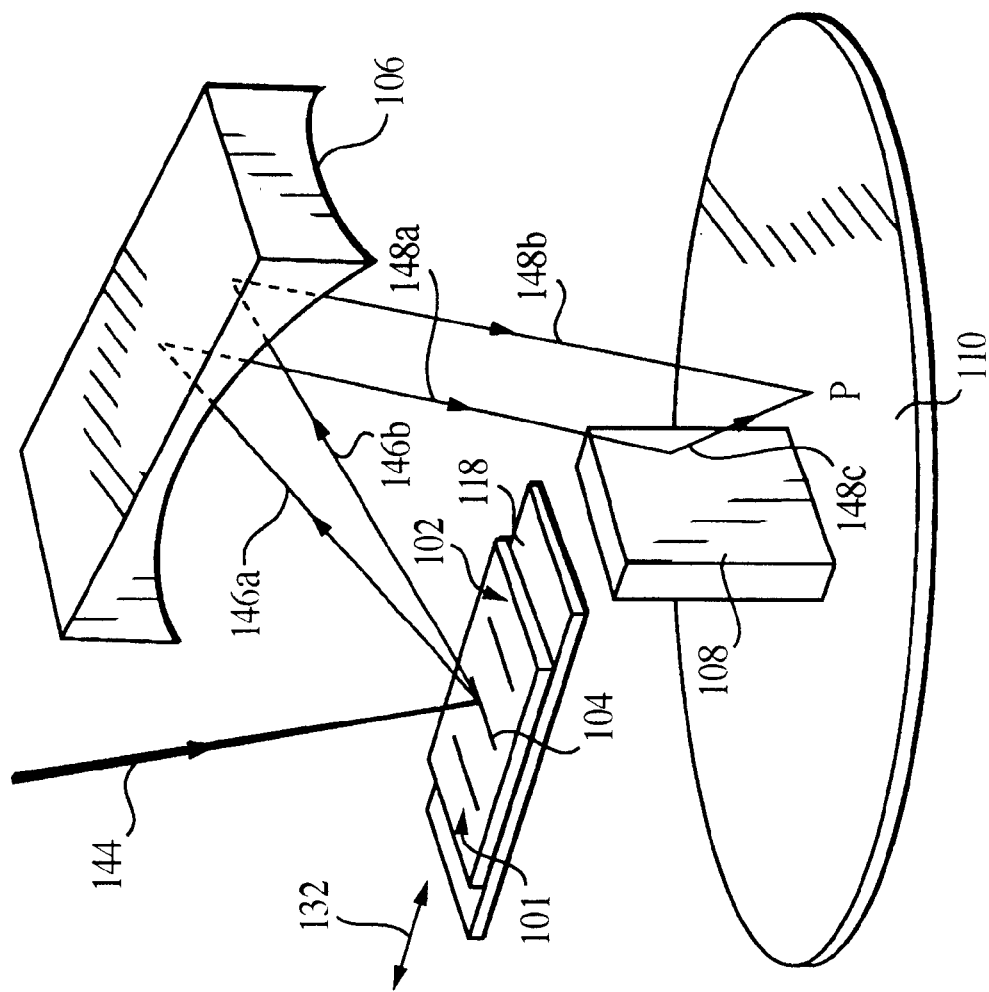
Figure 3B:
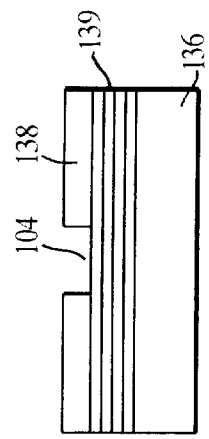
FIGS. 3a and 3b are perspective and cross-sectional views, respectively, of an optically reflective spatial filter.
Figure 3C:
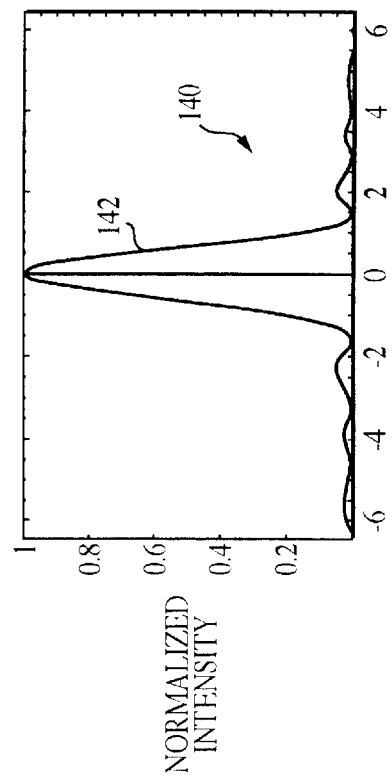
FIG. 3c is a graph of a single-slit diffraction pattern.
Figure 3A:
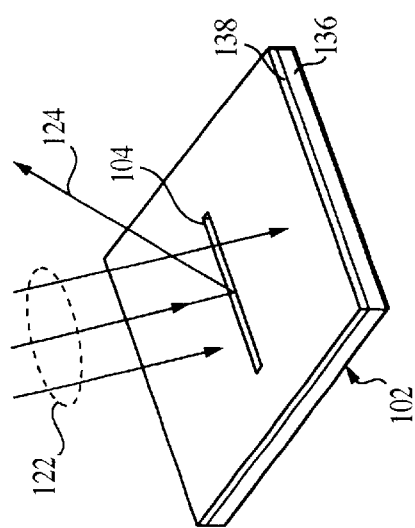

Referring to FIGS. 2a and 2b, an interferometric patterning system 100 includes an optical filter 102, a field mirror 106, and a mirror 108 placed on a substrate 110. A layer of photo-resist material is coated on substrate 110. Referring as well to FIGS. 3a and 3b, optical filter 102 reduces the bandwidth of incoming radiation to enhance temporal coherence. The filter 102 includes a reflective stack 136 with a light-absorbing layer 138. Light-absorbing layer 138 defines a set of slits 101 of different widths such that incident light on a selected slit exposes the reflective stack underneath. When a light beam 122 is directed through a slit, e.g., slit 104, reflective stack 136 reflects light within a narrower bandwidth (i.e., having wavelengths within a narrower range than the incident radiation). By reducing the bandwidth of the radiation, coherency is enhanced. Referring as well to FIG. 3c, light reflected by the stack is passed back through slit 104 to form a single-slit diffraction pattern 140 with a main lobe 142.

Field mirror 106 is arranged to reflect the divergent diffraction light waves in main lobe 142 and reflect these waves into plane waves (or waves that are substantially planar). By selecting radiation in the main lobe, the spatial coherence of the radiation is enhanced. An example of field mirror 106 is a parabolic mirror positioned so that its focal point is near the center of one of the set of slits 101. The field mirror directs radiation towards mirror 108 and substrate 110. Mirror 108 is configured as a Lloyd's mirror to generate interference patterns on the photo-resist layer on substrate 110.

FIG. 2b shows a ray-tracing diagram of incident light beam 144 that is directed towards single slit 104. Reflected light rays 146a and 146b emanate from slit 104 and are reflected by field mirror 106 into light rays 148a and 148b, respectively. Light rays 148a and 148b are substantially parallel to each other. Light ray 148a is reflected by plane mirror 108 into light ray 148c. Light ray 148c interferes with light ray 148b at point P. The interference can be constructive, in which a bright point is created, or destructive, in which a dark point is created.

An advantage of this arrangement is that interference patterns can be generated utilizing radiation from an incoherent light source. Optical filter 102 filters out the components in light beam 122 that are relatively incoherent (not in-phase) and reflects light waves that are relatively coherent by reflecting light within a narrow wavelength range and forming a single slit diffraction pattern from the narrow-band radiation. Field mirror 106 then collects the radiation from the main lobe of the diffraction pattern and converts the divergent in-phase light waves from optical filter 102 into plane waves suitable for generating interference patterns.

Field mirror 106 is mounted on a rotatable mount 112 that pivots around the center axis 116 of shaft 114. Field mirror 106 and mount 112 are configured such that when they pivot around center axis 116, the focal point of field mirror 106 remains substantially fixed at a position where the center of a slit is located. When field mirror 106 pivots around center axis 116, the incident angle of the light beam directed towards mirror 108 is changed, changing the pitch of the line structure in the interference pattern. Mirror 108 and substrate 110 are placed on an adjustable base 120. Mirror 108 and substrate 110 are adjusted so that the light waves reflected from field mirror 106 can form interference patterns on the surface of substrate 110.

Optical filter 102 is configured to slide along a guide 118 to allow selection of one of the multiple slits. In operation, the size of slit on optical filter 102 can be selected based on the amount of radiometric efficiency desired. A wider slit will produce light waves with a higher power at substrate 110, but at the expense of reduced coherence and thus reduced contrast between the bright and dark lines. Conversely, a narrower slit results in lower radiometric efficiency but higher contrast between the bright and dark lines. This allows tuning of the system for optimal contrast. The slidably arranged multiple slits have widths that are comparable to the wavelength of the main component in light beam 122.

Optical filter 102 is adjusted along a slidable guide 118 so that the center of the desired slit 104 is near the focal point of field mirror 106. Light beam 122 is focused near the center of slit 104. Field mirror 106 is adjusted so the light beam reflected from field mirror 106 is directed towards substrate 110 at an appropriate angle. Adjustable base 120 is then adjusted so that the light beam reflected from field mirror 106 is directed towards a portion of mirror 108 and a portion of substrate 110 to generate interference patterns.

Referring to FIGS. 3a and 3b, reflective stack 136 includes multi-layer coatings 139 having different refractive indices. For example, the multi-layer coatings 139 may be Mo/Si, Mo/Be, or MoRu/Be, or other types of multi-layers. When a light wave is directed towards the reflective stack, a portion of the light wave is reflected and the remaining portion is transmitted at each of the boundaries between the multiple layers of coatings, as well as at the top and bottom surfaces of the refractive stack. Each of the transmitted and reflected portions of the light wave has portions that are reflected or transmitted at the next boundary of the layers. The light waves go through multiple reflections at the various boundaries and interfere with one another. The thickness and the indices of the multiple layers are selected so that light waves having wavelengths within a narrow range will interfere constructively to form reflected light which emerges at the upper surface of reflective stack 136.

The thickness of the layers is in the range of about 1–10 nm and the number of layer pairs is, e.g., 80 to 100. The light-absorbing coating has a thickness in the range of about 50–150 nm. The absorber coating can be deposited by physical vapor deposition and may be, e.g., titanium nitride. The slits in the light-absorbing coating are formed by lithography techniques. It may be possible to decrease the bandwidth of the optical filter by a design with apodization. The design of reflective stacks is described in Claude Montcalm et al., "Extreme Ultraviolet Coatings for the Next Generation Lithography," Optical Interference Coatings, OSA Technical Digest (Optical Society of America, Washington DC 2001), pp. ThA1-1 to ThA1-3. Reflective stacks are available from the Lawrence Livermore National Laboratory in Livermore Calif.

Referring as well to FIG. 3c, reflected waves 124, after emerging from the reflective stack 136, pass through slit 104 to generate single-slit diffraction pattern 140 with main lobe 142. (In the example shown in FIG. 3c, diffraction pattern 140 is generated using a light source of 13.4 nm and a slit width of 0.5 μm.) The light waves in main lobe 142 is substantially coherent, meaning that the light waves are substantially in-phase. Assuming light-absorbing layer 138 has negligible thickness, the intensity I (θ) of single-slit diffraction pattern 140 is given by $$I(\theta) = \frac{\text{Sin}^2(\beta(\theta))}{\beta^2(\theta)} \quad \text{(Equ. 1)}$$

with $$\beta(\theta) \equiv \frac{\pi D}{\lambda} \text{Sin}(\theta),$$

where D is the slit width. The angle of the first zero $\theta_z$ occurs when $\beta(\theta_z)=\pi$, where $$\theta_z = \text{ArcSin}\left(\frac{\lambda}{D}\right). \quad \text{(Equ. 2)}$$

The angle of first zero is used to determine the size of field mirror 106. Field mirror 106 has a size, e.g., that substantially matches the main lobe 142 so that light in the side lobes of interference pattern 140 is not reflected by field mirror 106.

An advantage is that a system for testing photo-resist materials can be built with lower cost. Coherent light sources at the extreme ultra-violet wavelengths are typically more expensive than incoherent light sources. By using the optical design, a lower-cost incoherent light source, e.g., a laser-plasma or an electric discharge plasma light source, can be used to lower the overall cost of the photo-resist testing system. Laser plasma sources are available from TRW and electric discharge plasma sources are available from Cymer, San Diego, Calif.

Figure 4:
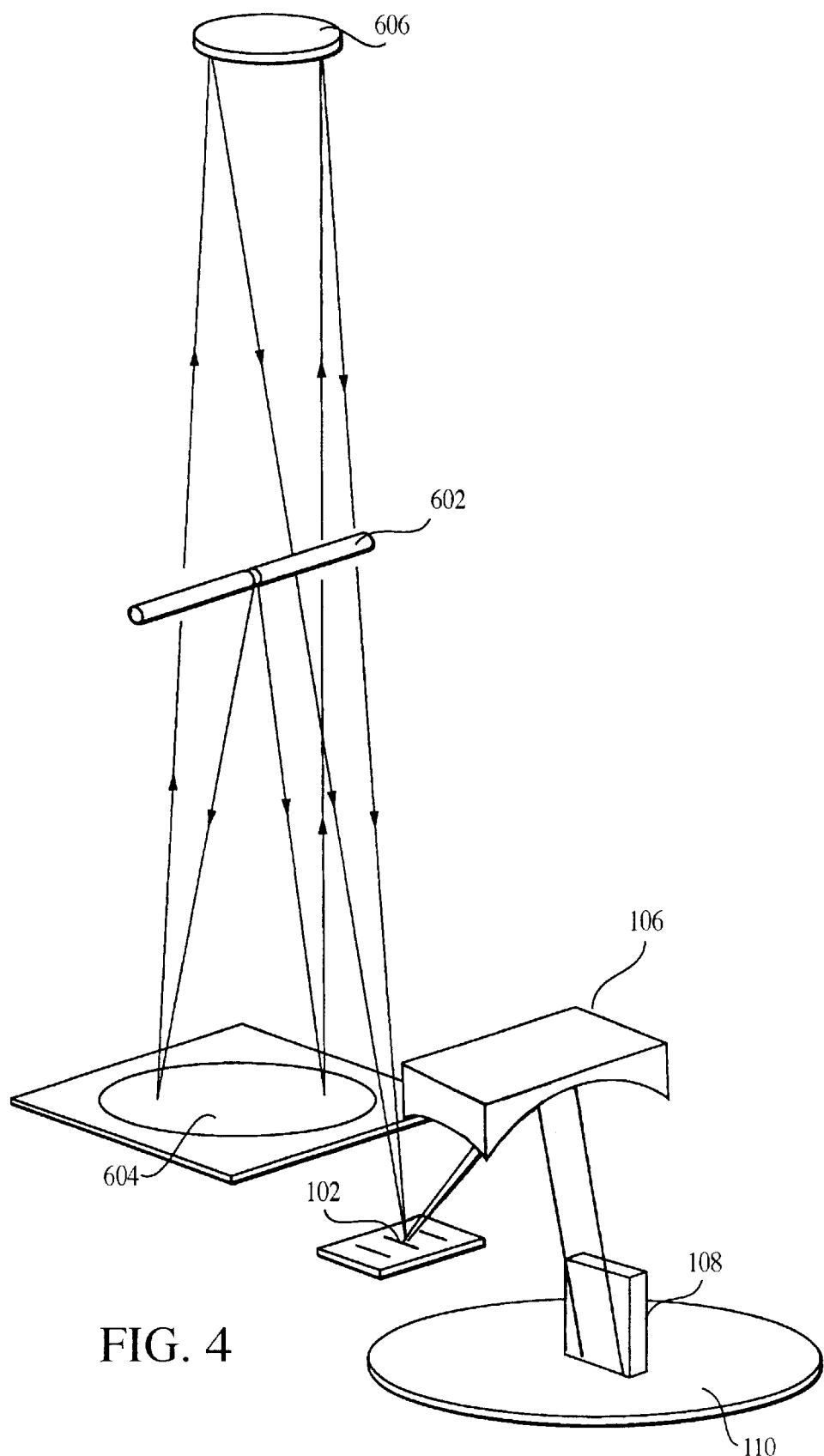
FIG. 4 is an illustration of a light source and optics that illuminates an interferometric patterning system.

Referring to FIG. 4, interferometric patterning system 100 is shown with a light source 602, an elliptical mirror 604, and a fold mirror 606. For clarity of illustration, the support structure used to support the various components are not shown. Light source 602 is, for example, a laser plasma or an electric discharge plasma, that generates incoherent light with a wavelength of about 13.4 nm. Elliptical mirror 604 is used as a condenser to collect light waves emanating from light source 602 and direct them towards fold mirror 606. Fold mirror 606 is used to adjust the angle and focus position of the light waves on optical filter 102. The system can produce interference patterns with having a pitch in the range of about 60 nm to 10 nm.

The reflection surface of elliptical mirror 604, fold mirror 606, and field mirror 106 have multi-layer coatings to reduce the bandwidth of the reflected light. The center wavelength of the pass-band of the elliptical mirror 604 is slightly less than 13.4 nm, and the center wavelength of the pass-band of the fold mirror 606 is slightly higher than 13.4 nm. Such combination results in a narrower overall pass-band. This design is particularly useful when the wavelength of the light source is less than about 157 nm.

The size of field mirror 106 used in this example is calculated as follows. The spatial filter 102 includes slit 104 having a width of 0.5 μm. Light passing through slit 104 produces diffraction pattern 140 with main lobe 142. According to Equation 2, the first zero $\theta_z$ of diffraction pattern 140 is equal to $$\theta_z = \text{ArcSin}\left(\frac{\lambda}{D}\right) = \text{ArcSin}\left(\frac{13.4 \text{ nm}}{0.5 \text{ μm}}\right) = 1.54 \text{ Degrees.}$$

Field mirror 106 is designed to have a size that substantially matches the main lobe 142 so that light in the side lobes of interference pattern 140 are not reflected by field mirror 106.

The following example is used to illustrate calculation of the radiometric efficiency and throughput of system 100. The elliptical mirror 604 subtends 0.196 steradian of the source's emission. Each mirror has a reflectivity of 70%, thus overall the transmission efficiency is 0.204. The slit has an area of 400×0.5 μm, and the ratio of the illuminated area of slit to the light spot projected near vicinity of slit is 0.159%. The amount of radiation reaching the substrate 110 is calculated to be 0.0005% of the total radiation generated from light source 602. If a 1.0 kW plasma laser is used, and the plasma radiates 0.5% into the 0.25% bandwidth defined by the reflective stack 136, then the total power of the light beam at the substrate 110 is 25 μW. The area of illumination at the substrate 110 is about 0.2275 cm², so the power density is about 0.11 mW/cm².

Following the example above, a 2.0 mJ/cm² photo-resist has an exposure time of 18 seconds. Various adjustments of the system can be made as follows. By reducing the focal length of the field mirror 106, for example, from 75 mm to 50 mm, the power density can be increased by a factor of 2.25 and the exposure time can be reduced to 8 seconds. By decreasing the diameter of the laser-plasma light source, the power density of light waves at the substrate can be increased.

Figure 5:
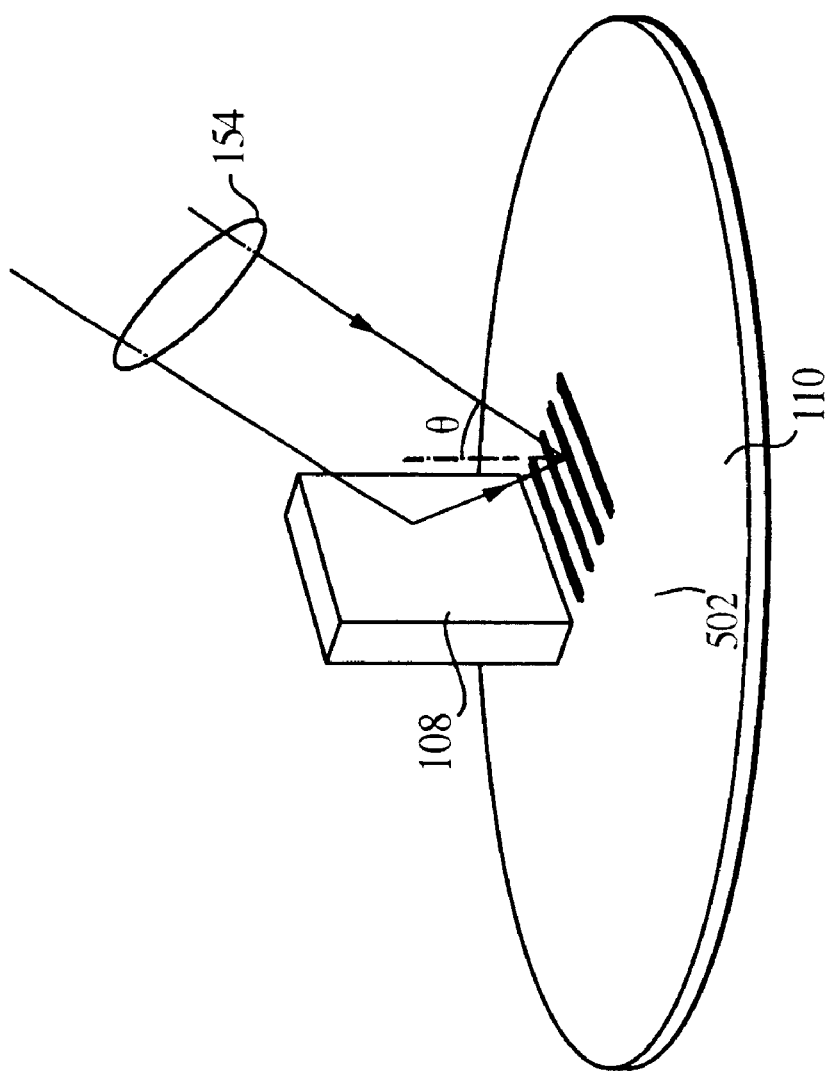
FIG. 5 is an illustration of interference patterns generated by the system of FIG. 4.

The number of lines in the interference pattern generated by system 100 can be calculated as follows. Referring to FIG. 5, interference pattern 502 having alternating bright and dark lines are generated in front of mirror 108. Light beam 154 is generated from an incoherent light source with subsequent spatial and spectral filtering, and has a wavelength of about 13.4 nm. Because light beam 154 is not totally coherent, the number of lines that can be obtained is limited. Optical filter 102 has a 0.25% bandwidth so that the wavelength has a range of λ=13.4±0.017 nm. The temporal coherence length, L, is determined by the equation:

$$L = \frac{\lambda}{2\pi}\left(\frac{\lambda}{\partial\lambda}\right) = \frac{13.4 \text{ nm}}{2\pi}(400) = 0.853 \text{ μm}. \quad \text{(Equ. 3)}$$

The number of lines N that can be obtained in the interference pattern 502 is calculated by using the equation N=L×sin(θ)/λ. For example, if sin(θ)=0.05, then N=3; if sin(θ)=0.1, then N=6; if sin(θ)=0.25, then N=16. Thus, for a given light source, the number of bright (or dark) lines that can obtained can be adjusted by adjusting the position of field mirror 106 to change the incident angle θ of light beam 154.

Various modifications can be made to the described embodiments. For example, the light source can be any light source of the desired wavelength. The optical filter can be transmissive rather than reflective. The optical filter can be designed so that only light having a wavelength within a narrow bandwidth is passed through. The field mirror 106 can have an aperture large enough to capture diffraction lobes that exist on either side of the main lobe 142 can also be used. Radiation from the side lobes will mostly be reflected to regions away from the plane mirror 108 and not affect the interference pattern 502. A larger field mirror allows a larger range of rotation about axis 116 (as shown in FIG. 2a), which allows a greater range of incident angle for the radiation directed towards plane mirror 108. The field mirror 106 may be substituted with a convex lens with its focal point near the center of the slit so that light emanating from the slit is converted into a plane wave after passing through the convex lens.

Interference patterns may be generated with a Young's configuration by using beam splitters technique or multiple filter and field mirror systems to generate multiple beams. The interference pattern generated by system 100 can be used in applications other than photo-resist testing, such as the writing of fiber Bragg gratings used in optical telecommunication systems or creation of micro-barcodes in security applications. The optical arrangement can be used to enhance coherence of radiation from other sources, including sources considered coherent. The center wavelength of the pass-band of the elliptical mirror 604 and the fold mirror 606 may also be the same (e.g., 13.4 nm) instead of being offset from the desired wavelength at the resist so as to achieve a higher radiometric efficiency.

Other embodiments are within the following claims.

What is claimed is:

1. An apparatus comprising:
   a filter arranged to reduce the bandwidth of incident radiation and produce a diffraction pattern therefrom;
   conversion optics configured to receive divergent radiation from said diffraction pattern and convert the radiation to substantially planar waves; and
   interference optics arranged to direct said planar waves into interference.

2. The apparatus of claim 1 wherein the interference optics is a mirror configured to reflect a portion of the substantially planar waves, such that the reflected portion interferes with a remaining portion to produce interference patterns.

3. The apparatus of claim 1 in which the filter includes a plurality of slits, selectively positioned to receive said incident radiation.

4. The apparatus of claim 3 wherein the filter comprises a reflective stack.

5. The apparatus of claim 4 in which the filter comprises a coating on said stack defining said slits.

6. The apparatus of claim 4, further comprising a sliding support to allow adjustment of the position of the filter to facilitate receiving incident radiation on a selected slit.

7. The apparatus of claim 1 wherein the filter comprises a reflective stack with a slit for receiving incident radiation.

8. The apparatus of claim 7 in which the conversion optics is sized to selectively receive radiation from a main lobe of said diffraction pattern.

9. The apparatus of claim 8 wherein the conversion optics comprises a parabolic mirror.

10. The apparatus of claim 9, further comprising rotating support to support the parabolic mirror at positions such that the focal point is substantially near the center of the slit that receives the incident radiation.

11. The apparatus of claim 1 wherein the conversion optics is coated with multiple layers so as to reduce the bandwidth of radiation reflected from the multiple layers.

12. The apparatus of claim 1, further comprising a light source configured to generate the incident radiation.

13. The apparatus of claim 12 wherein the light source is an incoherent source.

14. The apparatus of claim 12 wherein the source is a plasma source.

15. The apparatus of claim 13 wherein the source is a laser plasma or an electric discharge plasma.

16. The apparatus of claim 1 or 15 wherein the incident radiation has a wavelength of less than about 157 nm.

17. Apparatus for testing properties of a photo-resist material, comprising:
   a surface configured to support a layer of the photo-resist material;
   an optical filter comprising a reflective stack and a slit;
   a parabolic mirror disposed at a location such that the focal point of the parabolic mirror is near the slit; and
   a plane mirror disposed to receive radiation from the parabolic mirror and form an interference pattern on the photo-resist.

18. The apparatus of claim 17, further comprising a slit width adjustment.

19. The apparatus of claim 17, further comprising mechanism for adjusting the position of the parabolic mirror to adjust the angle between a main axis of the parabolic mirror and a surface normal of the plane mirror.

20. The apparatus of claim 17, further comprising an elliptical mirror to collect radiation from a light source.

21. The apparatus of claim 20, further comprising a fold mirror to receive radiation from the elliptical mirror and direct the radiation towards the optical filter, the fold mirror being adjustable to allow adjustment of the angle and focus position of the radiation on the optical filter.

22. The apparatus of claim 21 wherein the fold mirror and the elliptical mirror have multiple coatings to reduce the bandwidth of radiation reflected from the mirrors.

23. A method comprising:

receiving incident light waves;

filtering the incident light waves using a reflective stack with layers to reduce the bandwidth of light waves that are reflected;

passing the filtered light waves through a slit to generate an interference pattern having a main lobe;

converting the light waves in the main lobe into light waves that are substantially planar; and generating alternating bright and dark regions on a surface from the light waves that are substantially planar.

24. The method of claim 23, further comprising modifying the propagation direction of the light waves that are substantially planar relative to the surface to adjust the distance between the bright and dark regions.

25. The method of claim 23, further comprising selecting a slit of a specified width from slits of different widths.

* * * * *